(12) United States Patent
Lingle

(10) Patent No.: US 7,300,701 B2
(45) Date of Patent: Nov. 27, 2007

(54) HIGH DURABLE, LOW-E, HEAT TREATABLE LAYER COATING SYSTEM

(75) Inventor: Philip J. Lingle, Temperance, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 381 days.

(21) Appl. No.: 10/150,014

(22) Filed: May 20, 2002

(65) Prior Publication Data

US 2002/0192474 A1    Dec. 19, 2002

Related U.S. Application Data

(63) Continuation of application No. 09/795,976, filed on Mar. 1, 2001, now Pat. No. 6,445,503.

(60) Provisional application No. 60/217,101, filed on Jul. 10, 2000.

(51) Int. Cl.
B32B 17/06        (2006.01)

(52) U.S. Cl. .................. 428/432; 428/426; 428/448; 428/689; 428/698; 428/699; 428/701; 428/702; 428/704

(58) Field of Classification Search ............. 428/432, 428/446, 472, 673, 697, 698, 699, 701, 702, 428/426, 448, 689, 704
See application file for complete search history.

(56) References Cited

U.S. PATENT DOCUMENTS

| | | |
|---|---|---|
| 3,682,528 A | 8/1972 | Apfel et al. |
| 4,413,877 A | 11/1983 | Suzuki et al. |
| 4,782,216 A | 11/1988 | Woodard |
| 4,786,783 A | 11/1988 | Woodard |
| 4,799,745 A | 1/1989 | Meyer et al. |
| 4,806,220 A | 2/1989 | Finley |
| 4,898,789 A | 2/1990 | Finley |
| 4,898,790 A | 2/1990 | Finley |
| 5,028,759 A | 7/1991 | Finley |
| 5,059,295 A | 10/1991 | Finley |
| 5,201,926 A | 4/1993 | Szczyrbowski et al. |
| 5,229,194 A | 7/1993 | Lingle et al. |
| 5,242,560 A | 9/1993 | Lingle et al. |
| 5,262,032 A | 11/1993 | Hartig et al. |

(Continued)

FOREIGN PATENT DOCUMENTS

DE        1 621 347        6/1971

(Continued)

OTHER PUBLICATIONS

U.S. Appl. No. 60/217,101, filed Jul. 20, 2000.

(Continued)

Primary Examiner—Andrew Piziali
(74) Attorney, Agent, or Firm—Nixon & Vanderhye P.C.

(57) ABSTRACT

A coated article including a coating supported by a glass substrate is provided. In certain example embodiments, the coating includes from the glass substrate outwardly a first dielectric layer(s), an infrared (IR) reflecting layer (e.g., Ag), $NiCrO_X$ layer, at least one dielectric layer including silicon nitride and/or tin oxide, another IR reflecting layer (e.g., Ag), and at least another dielectric layer including silicon nitride and/or tin oxide.

7 Claims, 2 Drawing Sheets

U.S. PATENT DOCUMENTS

| | | |
|---|---|---|
| 5,270,517 A | 12/1993 | Finley |
| 5,298,048 A | 3/1994 | Lingle et al. |
| 5,364,518 A | 11/1994 | Hartig et al. |
| 5,425,861 A | 6/1995 | Hartig et al. |
| 5,514,476 A | 5/1996 | Hartig et al. |
| 5,557,462 A | 9/1996 | Hartig et al. |
| 5,584,902 A | 12/1996 | Hartig et al. |
| 5,688,585 A | 11/1997 | Lingle et al. |
| 5,770,321 A | 6/1998 | Hartig et al. |
| 5,800,933 A | 9/1998 | Hartig et al. |
| 5,821,001 A | 10/1998 | Arbab et al. |
| 5,834,103 A | 11/1998 | Bond et al. |
| 5,897,372 A | 4/1999 | Howard |
| 5,902,505 A | 5/1999 | Finley |
| 5,942,338 A | 8/1999 | Arbab et al. |
| 6,014,872 A | 1/2000 | Hartig et al. |
| 6,045,896 A | 4/2000 | Boire et al. |
| 6,059,909 A | 5/2000 | Hartig et al. |
| 6,060,178 A | 5/2000 | Krisko |
| 6,086,210 A | 7/2000 | Krisko et al. |
| 6,132,881 A | 10/2000 | Hartig et al. |
| 6,142,642 A | 11/2000 | Krisko et al. |
| 6,159,607 A | 12/2000 | Hartig et al. |
| 6,190,776 B1 | 2/2001 | Demiryont |
| 6,322,881 B1 | 11/2001 | Boire et al. |
| 6,340,529 B1 * | 1/2002 | Ebisawa et al. ............ 359/359 |

FOREIGN PATENT DOCUMENTS

| | | |
|---|---|---|
| DE | 42 11 363 | 6/1971 |
| EP | 0 857 700 A1 | 8/1998 |
| EP | 0 963 960 A1 | 12/1999 |
| EP | 0 999 192 A1 | 5/2000 |
| WO | WO 98/58885 | 12/1998 |

OTHER PUBLICATIONS

U.S. Appl. No. 09/795,976, filed Mar. 1, 2001.
Partial European Search Report dated Oct. 8, 2001.
European Search Report dated Jan. 10, 2002.

* cited by examiner

Fig. 3
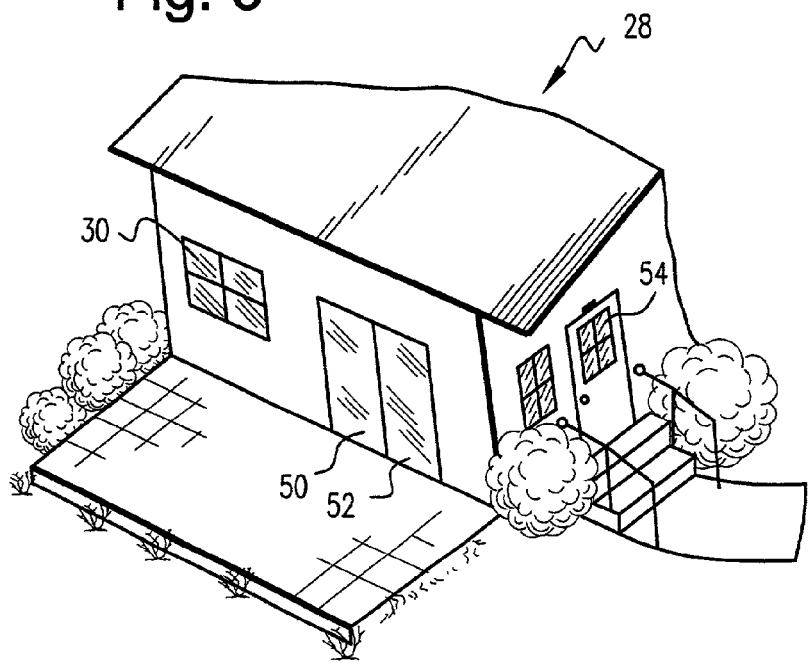
Fig. 4
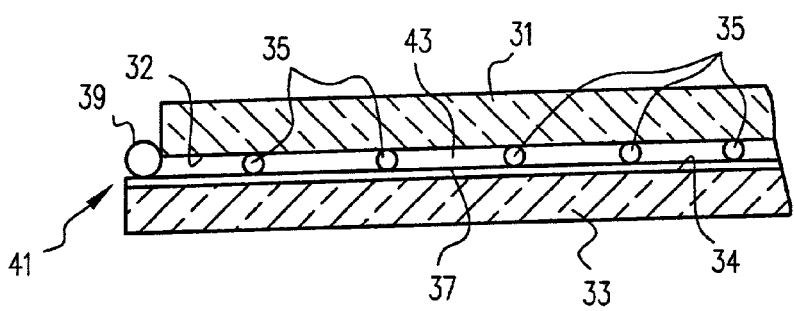
Fig. 5A
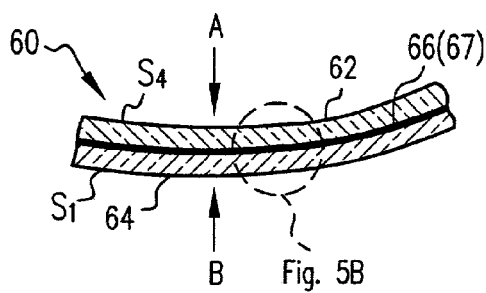
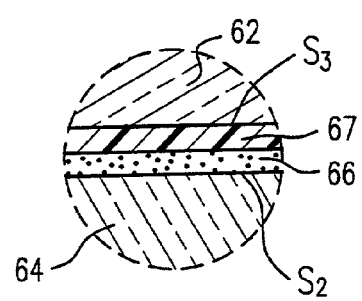
Fig. 5B

HIGH DURABLE, LOW-E, HEAT TREATABLE LAYER COATING SYSTEM

This application claims the benefit of Provisional Application Ser. No. 60/217,101, filed Jul. 10, 2000, the entire content of which is hereby incorporated by reference in this application.

This application is a continuation of application Ser. No. 09/795,976, filed Mar. 1, 2001, now U.S. Pat. No. 6,445,503, the entire content of which is hereby incorporated by reference in this application.

This invention relates to mechanically durable layer coating systems particularly useful in laminated, vehicular windshields and insulating glass units. More particularly, this invention relates to such systems which are heat treatable and manifest low values of emissivity.

BACKGROUND OF THE INVENTION

Layer coating systems, particularly those formed by the sputter coating process are well known in the architectural and automotive field. Such coatings for solar management purposes seek to achieve among other characteristics, the recuisite reflection of infrared energy and at the same time, the requisite amount of transmittance of visible light. In the automotive windshield art, for example, the windshield normally must have a visible light transmittance of no less than 70% even when laminated. The need for high infrared reflectance and high visible transmittance often conflict with each other. Making the design of an appropriate, commercial layer system even more difficult is the further need to achieve a desirable (usually substantially neutral) color, and/or low visible reflectivity (i.e., a non-mirror like appearance). Adding still further to the problems faced in the art in achieving a commercially acceptable product is either the need or desirability of forming a layer system which is heat treatable (i.e. well not deteriorate when going through a heat treatment such as bending, tempering or heat strengthening).

Design criteria for such systems do not normally focus alone on sea treatability and/or solar management characteristics as described above. Rather, a major problem that has often faced the I.G. unit and automotive windshield art after an otherwise acceptable sputter-coated layer system has been developed from a solar management and heat treatability perspective, is the need to achieve mechanical durability. This is due to the fact that after the layer system is deposited, the intermediate product so produced usually requires mechanical handling to place it in its final form. Such handling steps are often of such a nature, in this respect, that the layer coating must be contacted by hand or by some mechanical device, and thus subject to abrasion. If the coating does not have sufficient "mechanical durability," numerous rejects caused by scratching, particle abrasion, etc. are likely to occur during the manufacturing process.

Such a problem is particularly acute in the laminated (vehicular) windshield and the insulating glass unit (I.G. unit) arts. In these arts, it is to be noted, the layer system need not always be truly "chemically durable" since the layer is usually not exposed to weather because it is located between the laminated glass sheets in the windshield or between the two or more glass sheets in an I.G. unit. In other instances, however, where chemicals are to come into contact with the layer system during or after the manufacturing process, chemical durability is also desirable to achieve.

To demonstrate the need for mechanical durability, a typical manufacturing process for a conventional laminated front, bent automobile windshield may be referenced. In such a process, after jumbo sheets are cut from glass coming from the float process and then sputter coated with the layer system of choice, steps such as washing with revolving brushes, placement of the sheets in shipping racks, further cutting to particular sizes and washing, are typical preliminary steps which contain procedures that can mechanically harm the coating if it is not sufficiently durable.

Thereafter, in the making of a typical laminated windshield, numerous procedures are engaged in which require such potentially mechanically damaging steps as suction cup lifting, edge grinding, racking for shipment, flipping, separation using particles of diatomaceous earth and the like. Thereafter, the two sheets must be slumped together in a furnace to achieve their laminated shape (thus requiring heat treatability) The glass sheets must then be separated, the vinyl polymer safety sheet inserted (where a potential for scratching occurs) and, then, finally the sheets placed back together again and pressed together (with the aforesaid particles of diatomaceous earth often still therebetween with their potential for abrasive scratching) to form the windshield product. The need for a highly durable layer coating system in such a product is self evident and its achievement is a known problem, as aforesaid, in the art In commonly owned U.S. Pat. No. 5,557,462 (having overlapping inventorship herewith) there is disclosed a dual silver, low-E layer coating system useful in I.G. units. In the preferred embodiments mechanical durability was found to be quite acceptable even in the manufacture of I.G. units which, as aforesaid, requires potentially damaging handling steps. The preferred systems of this '462 invention were also chemically durable. In addition, emissivity values were quite low, as was reflectance. Color was also in the acceptable range. However, the systems disclosed were not heat treatable and thus could not realistically be used where bent windshields were involved, or other heat treatments such as tempering or heat strengthening or glass welding were later contemplated.

In commonly owned U.S. Pat. No. 5,688,585 (having overlapping inventorship herewith) matchable, heat treatable layer systems are disclosed which are highly durable and chemically resist. The systems contemplated, however, are non-silver containing and thus could not avail themselves of the advantages of silver in achieving certain solar management properties, particularly infrared energy reflection, for which silver is commonly used in the sputter coating art. Moreover, while achieving high durability, visible transmittance values, in practice, in certain systems both before and after heat treatment, were less than about 70%. Such systems could, therefore, not be used as windshields. Moreover, due perhaps to the lack of silver, emissivity values while considered "low-E" were, in fact, in the relatively high range for such infrared reflecting glass products.

In another known layer system which is prior art to our invention, there is presented a dual silver system which comprises from the glass substrate outwardly (and which has approximately the following layer thicknesses):

STD I

| Layer | Thickness (Å) |
| --- | --- |
| $Si_3N_4$ and/or $TiO_x$ (possibly) | (125) |
| ZnO | (380) |
| $TiO_x$ | (10-40) |
| Ag | (140-160) |
| ZnO | |

-continued

STD I

| Layer | Thickness (Å) |
|---|---|
| Si$_3$N$_4$ | |
| ZnO | (800) |
| Si$_3$N$_4$ | |
| ZnO | |
| TiO$_x$ | (10-40) |
| Ag | (120) |
| ZnO | (360) |
| Glass Substrate | |

This system is heat treatable but loses mechanical durability upon heat treatment and generally demonstrates poor chemical durability.

In still another known system, a heat treatable system is presented which is exemplified by the following commercialized structure (the top three layers apparently being optional):

STD II

| Layer | Thickness (Å) |
|---|---|
| ZnSnO$_x$ | (50-100) |
| TiO$_x$ (possibly) | (25) |
| ZnSnO$_x$ | (350) |
| TiO$_x$ | (10-50) |
| Ag | (140) |
| ZnSnO$_x$ | (900) |
| TiO$_x$ | (10-50) |
| Ag | (110) |
| ZnSnO$_x$ | (360) |
| Glass | |

Our testing has demonstrated that this layer system lacks mechanical durability both before and after heat treatment as the term "mechanical durability" is defined herein.

Another known product which exhibits a lack of durability consists of a repetitive three membered layer structure of ZnO/SnO$_x$/ZnO which sandwiches two layers of silver. Other layer systems in generally this and the above-described generic category are found in U.S. Pat. Nos. 4,413,877; 4,898,789; 4,898,790 and 4,806,220.

In view of the above it is apparent that there exists a need in the art for a layer coating system useful in laminated windshields, I.G. units and other coated glass produces which is highly durable, and preferably is also, heat treatable, has significantly low-E qualities, and, in certain embodiments, manifests high visible transmittances sufficient for the automotive windshield art. It is a purpose of this invention to fulfill this and other needs in the art which will become more apparent once given the following disclosure.

SUMMARY OF THE INVENTION

Generally speaking this invention fulfills the above-described needs in the art by providing a glass article having a sputter coated layer system thereon which from the substrate outwardly includes:

a) a layer comprised of SnO$_x$ wherein x is $\leq 2.0$;

b) a layer comprised of TiO$_x$ wherein x is <2.0 or NiO$_x$ where x is $\leq 1.0$;

c) a layer comprised of Ag;

d) a layer comprised of NiO$_x$ wherein x is less than 1.0;

e) a layer comprised of SnO$_x$ wherein x is $\leq 2.0$;

f) a layer comprised of TiO$_x$ wherein x is <2.0 or NiO$_x$ where x is $\leq 1.0$;

g) a layer comprised of Ag;

h) a layer comprised of NiO$_x$ wherein x less than 1.0;

i) a layer comprised of SnO$_x$ wherein x is $\leq 2.0$; and j) a layer comprised of Si$_3$N$_4$.

In certain preferred embodiments the layers are of a thickness such that the layer system is mechanically durable and in other embodiments the layer system is heat treatable, or both heat treatable and mechanically durable.

In certain further preferred embodiments the layer systems of this invention are also chemically durable. In particular embodiments in this respect, the layer systems of this invention are employed internally of a laminated glass structure such as an automotive windshield, or on an internal surface of a dual or multi-pane I.G. unit.

In still further embodiments, haze, as defined herein, is reduced or eliminated by separating layer (e) above into two seperate layers and imposing between them another layer, preferably of Si$_3$N$_4$, which is believed to reduce stress in at least the two separate layers of SnO$_x$ that adjoin this additional layer.

This invention will now be described with respect to certain embodiments thereof along with reference to certain illustrations wherein:

IN THE DRAWINGS

FIG. 3 is a partial schematic perspective view of a house employing as a window, door, and wall an I.G. unit and/or other glass pane structure provided with a sputter coated layer system, as contemplated by this invention.

FIG. 4 is a partial cross-sectional schematized view of an embodiment of an I.G. unit in a pre-fabrication stage.

FIG. 5 is a partial sectional schematized view of a bent laminate (e.g., an automotive windshield) having therein a sputter coated layer system, as contemplated by this invention, its internal structure being illustrated in the magnified circular cross-sectional view to the right thereof.

DETAILED DESCRIPTION OF CERTAIN EMBODIMENTS OF THE INVENTION

Figure 2A:
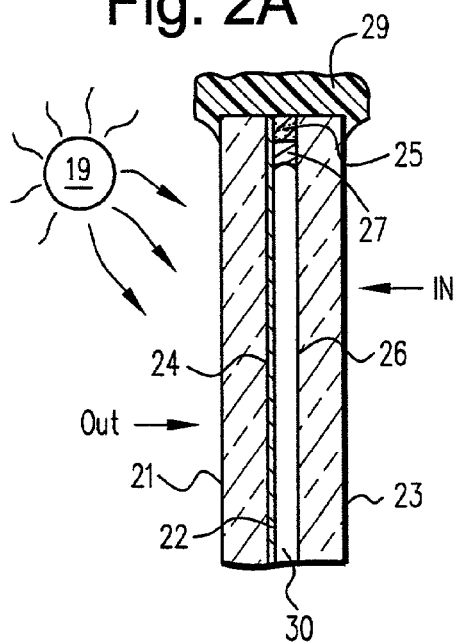
FIG. 2A is a partial cross-sectional view of an I.G. unit having therein a sputter coated layer system, as contemplated by this invention.

As used herein, the term I.G. unit is synonymous with the term "insulating glass unit" and is used according to its conventional and well known meaning in the art. FIGS. 2A and 4 illustrate, schematically, a typical I.G. unit contemplated for use with the coating systems of this invention. Generally speaking, as contemplated herein, I.G. units are comprised of two or more parallel, spaced sheets of glass held in spaced relationship by an appropriate frame structure. Each space between the two or more sheets, typically about one-half inch, either has air in it or an inert gas such as argon, or is partially evacuated. Most are provided with a desiccant within the space to prevent "fogging." It is, of course, understood that FIGS. 2A and 4 are merely examples of many types of I.G. units used for thermal and/or sound insulation purposes, as contemplated by this invention.

Figure 2B:
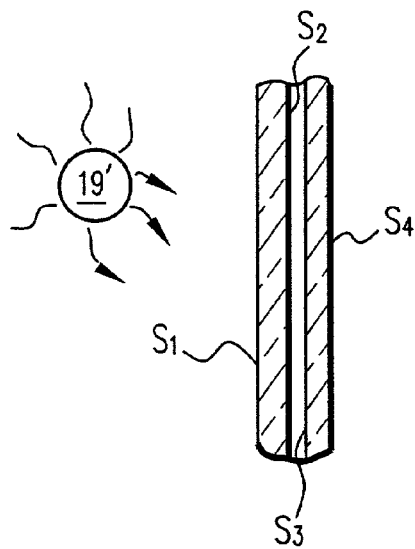
FIG. 2B is a generic laminate to demonstrate conventional numbering of the surfaces presented.

FIG. 2B is presented to illustrate the conventional numbering of the surfaces in an I.G. unit, or in a laminate which spaces the two glass sheets illustrated by employing therebetween a polymeric sheet (not shown) such as in a conventional automotive windshield. The surfaces involved are conventionally numbered sequentially from the outside (shown by sun 19') to the inside (i.e., 1, 2, 3, 4 . . . etc.) and are here designated as $S_1 \ldots S_4$, the "S" simply signifying "surface."

In this respect, the term "laminate" is also well understood in the glass art and is used herein according to its well known meaning. Glass laminates normally include two or more unspaced, or spaced by a polymeric material, substrates of glass (shaped or unshaped sheets of glass) which, in the instances of this invention will have a least one coating of a layer system of this invention thereon, normally but not always located at the interface of the two sheets. Such laminates may be flat structures (e.g. sheets cut to size) used in architectural windows, door or flat windows in the vehicular art, or are bent to meet specific architectural or automotive needs (e.g. building skylights or front automotive windshields). For example, FIG. 5 schematically illustrates a partial section of a typical two glass sheet (62, 64) laminate 60 having a layer coating system 66 on one if its inner surfaces, here $S_2$. When used as a windshield, the space between sheets 62, 64 would normally also be provided with a safety sheet of polyvinyl butyrol 67 as shown in the optional circle in FIG. 5. The letter "B" signifies the outside sheet, the letter "A" signifying the inside sheet, with respect, for example, to an automobile having laminate 60 as its front windshield.

Certain terms are prevalently used in the glass coating art, particulary when defining the properties and solar management characteristics of coated glass. Such terms are used herein in accordance with their well known meaning. For example, as used herein:

Intensity of reflected visible wavelength light, i.e. "reflectance" as defined herein is defined by its percentage and is reported as $R_xY$, wherein "x" is either "G" for glass side or "F" for film side. "Glass side" (e.g. "G") assumes, with reference to FIG. 22, that the coating is on sur ace $S_2$ or, in other words, in the I.G. unit of FIG. 2A, on surface 24, and the measurement is taken from the surface $S_1$ (FIG. 22) or 21 (FIG. 2A) while "film side" (e.g. "F") assumes the coating is still on surface 24 or $S_2$ but the measurement is taken from the surface 23 or $S_4$ side. If measurements are to be taken from other sides or the coating is on another surface, such values are considered to be equivalents to the values reported herein as described. "Y" is the value as reported in and calculated by ASTM-308-95.

Color characteristics are measured and reported herein using the CIE LAB 1976 a*, b* coordinates and scale (i.e. the CIE 1976 a*b* diagram). See also CIE Pub. No. 15.2. Other similar coordinates may be equivalently used such as by the subscript "h" to signify the conventional use of the Hunter method (or units) Ill. C, 10° observer, or the CIE LUV u*v* coordinates. These scales are defined herein according to ASTM D-2244-93 "Standard Test Method for Calculation of Color Differences From Instrumentally Measured Color Coordinates" Sep. 15, 1993 as augmented by ASTM E-308-95, Annual Book of ASTM Standards, Vol. 06.01 "Standard Method for Computing the Colors of Objects by Using the CIE System" and/or as reported in IES LIGHTING HANDBOOK 1981 Reference Volume.

Reference to and measurement of certain characteristics are more applicable to automotive usage (e.g. windshields), while others are more applicable to architectural usage (e.c. I.G. units). Some characteristics are useful in both arts. Thus, the various tests or standards used to determine these characteristics are at times the same or are different or even divergent as between automotive and architectural specifications. Color as defined and tested above, is an example of a characteristic determined the same way for both architectural and automotive purposes. Other characteristics, as listed in the table immediately below, are determined differently in the two arts, or are used in only one of the two arts. In every instance, however, these terms, when used herein are used in accordance with their well known meaning.

In this respect, and generally speaking, the term "transmittance" herein means solar transmittance, which is made up of visible light transmittance ($T_{VIS}$) infrared energy transmittance ($T_{ir}$) and ultraviolet light transmittance ($T_{uv}$). Total solar energy transmittance ($T_{solar}$) can be characterized as a weighted average of these other values. While this general description is applicable for both the automotive and architectural arts, quantitative determination is often accomplished by reference to a somewhat different testing procedure. For example, $T_{VIS}$ for automotive purposes is usually determined by the Ill.A 2° observer technique. For architectural purposes, it is usually determined by the Ill.C 2° observer technique. Both techniques are found in ASTM E-308-95. Moreover, as reported therein the separation by wavelength ranges as between Ill.A and Ill.C is somewhat different. For automotive purposes $T_{VIS}$ is from 380-720 nm; infrared is from 800-2500 nm; ultraviolet is from 300-400 nm; and total solar is from 300-2500. For architectural purposes, the ultraviolet is 300-380, but $T_{VIS}$ is from 380-780 nm; infrared in the near range is from 800-2500 nm and in the thermal range from 2500-50,000 nm; and total solar is calculated according to ASTM E-891-87, and is a range of 300-4000 nm. For purposes of emissivity (architectural, E) a particular infrared range of 2500-40,000 nm is employed.

The following table, by reference to conventional, published testing procedures defines the characteristics (terms) as used herein.

TABLE I

| Term | Standard for Determining | |
| --- | --- | --- |
| (Characteristic) | Automotive | Architectural |
| $T_{VIS}$ | Ill. A 2° Obs. ASTM E-308-95 ASTM 308/2244-93 | Ill. C 2° Obs. ASTM E-308-95 (the "Y" value) |
| $R_{VIS}$ | Same as $T_{VIS}$, Tables 5.5 and 5.19 | $R_FY$ on $R_GY$ value in E-308-95 |
| $T_{IR}$ | DIN 410 | |
| $T_{UV}$ | GM meohod ISO 13837 or SAE J1796 (1995-05) | ASTM E-891-87 using window 4.1 LBL 35298 (1994) |
| $T_{solar}$ | DIN 410 and ISO 13837 (12/98) Table 1, p. 22 | ASHRAE 142 |
| $R_{solar}$ | Same as $T_{solar}$ | ASHRAE 142 |
| $R_{ir}$ | Same as $T_{ir}$ | |
| Color | CIE LAB 1976 a*b* (CIE PUB No. 15.2) | CIE LAB 1976 a*b* (CIE PUB No. 15.2) |
| S.C. (shading coefficient) | | ASHRAE 142 |
| s.h.g.c. (solar heat gain | | ASHRAE 142 |

TABLE I-continued

| Term | Standard for Determining | |
|---|---|---|
| (Characteristic) | Automotive | Architectural |
| coefficient) | | |
| $E_n$ | | (described below) |
| $E_h$ | | (described below) |
| U value | | ASHRAE or ASTM C236 |
| Rs | | (described below as "sheet resistance") |

"Emissivity" is a measure, or characteristic of both absorption and reflectance of light at given wavelengths. It is usually represented by the formula:

$$E = 1 - \text{Reflectance}_{film}$$

For architectural purposes, emissivity values become quite important in the so-called "mid-range", sometimes also called the "far range" of the infrared spectrum, i.e. about 2,500-40,000 nm., for example, as specified by the WINDOW 4.1 program, LBL-35298 (1994) by Lawrence Berkeley Laboratories, as referenced below. The term "emissivity" as used herein, is thus used to refer to emissivity values measured in this infrared range as specified by ASTM Standard ASTME 1585. In this Standard, emissivity is reported as hemispherical emissivity ($E_h$) and normal emissivity ($E_n$)

The term $T_{uv}$ is a term well understood in the architectural art and is used herein in accordance with this known meaning. It is ultra violet light transmittance and is calculated using ASTME 891-87 and employing WINDOW 4.1 program, LBL-35298 (1994) by Lawrence Berkeley Laboratories, Berkeley, Calif.

The actual accumulation of data for measurement of such emissivity values is conventional and may be done by using, for example, a Beckman Model 4260 spectrophotometer with "VW" attachment (Beckman Scientific Inst. Corp.). This spectrophotometer measures reflectance versus wavelength, and from this, emissivity is calculated using the aforesaid ASTM 1585 Standard.

Another term employed herein is "sheet resistance". Sheet resistance ($R_s$) is a well known term in the art and is used herein in accordance with its well known meaning. It is here reported in ohms per square units. Generally speakings, this term refers to the resistance in ohms for any square of a layer system on a glass substrate to an electric current passed through the layer system. Sheet resistance is an indication of how well the layer is reflecting infrared energy, and is thus often used along with emissivity as a measure of this characteristic. "Sheet resistance" is conveniently measured by using a 4-point probe ohmmeter, such as a dispensable 4-point resistivity probe with a Magnetron Instruments Corp. head, Model M-800 produced by Signatone Corp. of Santa Clara, Calif.

"Chemical durability" or "chemically durable" are used herein synonymously with the term of art "chemically resistant" or "chemical stability". Chemical durability is determined by boiling a 2"×5" sample of a coated glass substrate in about 500 cc of 1% HCl for one hour (i.e. at about 220° F.). The sample is deemed to pass this test (and thus the layer system is "chemically resistant" or is deemed to be "chemically durable" or to have "chemical durability") if the sample's layer system shows no visible discoloration or no pinholes greater than about 0.003" in diameter after this one hour boil.

"Mechanical durability" as used herein is defined by a test which uses a Pacific Scientific Abrasion Tester (or equivalent) wherein a 2"×4"×1" nylon brush (e.g. as manufactured by Wright Bernet of Franklin Park, Ill. Model 1280 Hand & Nail Brush) is cyclically passed over the layer system in 500 cycles employing 150 gm of weight, applied to a 6"×17" sample. In this test, if no substantial, noticeable scratches appear when viewed with the naked eye under visible light, the test is deemed passed, and the article is said to be "mechanically durable" or to have "mechanical durability".

Thicknesses of the various layers in the systems reported are measured by, and thus the term, "thickness" as used herein is defined by, alternative techniques. In one technique, known optical curves, or, in the alternative, tie use of a conventional needle profilometer is employed. In another and particularly advantageous technique, a multi-wavelength, variable angle spectrophotometric ellipsometer made by J.A. Woollam Co., Lincoln, Nebr., is used.

The term "U-value" (synonymous with "thermal transmittance") is a term well understood in the art and is used herein according to this well known meaning. "U-value" herein is reported in terms of $BTU/hr/ft^2/°$ F., and may be determined according to the guarded hot box method as reported in, and according to ASTM designation: C236-89 (reapproved 1993) or according to ASHRAE Standard 142 (see below).

The terms "shading coefficient," "solar heat gain coefficient," solar transmittance ($T_{solar}$), and solar reflectance ($R_{solar}$) are terms well understood in the art and are used herein according to their well known meanings. They are determined according to ASHRAE Standard 142 "Stardard Method for Determining and Expressing the Heat Transfer and Total Optical Properties of Fenestration Products" by ASHRAE Standards Project Committee, SPC 142, September 1995.

The term "heat treatable" (or its synonym "heat treatability") when used herein is employed according to its recognized meaning in the art. In general, the term as used herein refers to the ability of the coated layer system to withstand the type of heat treatment to which it is subjected without any material amount of an adverse affect upon its required characteristics.

Tolerable, so as to be included within the definition of "heat treatable", are changes for the better in the layer system resulting from the heat treatment employed. In addition to increased visible transmittance, such heat treatments, for example, may beneficially result in lower emissivity and sheet resistance values. Such beneficial changes do not render the layer systems of this invention nonheat-treatable. For most commercial purposes, for example, an emissivity change for the better (i.e. lowering of the E value) due to the heat treatment is not only tolerated but desirable because it does not affect visual appearance although it is normally important that the change take place uniformly across the substrate and is independent of the parameters used to perform the heat treatment.

The types of heat treatments generally contemplated herein are exemplified by such known techniques as bending, tempering, glass welding, heat strengthening and certain processes used to seal insulating glass units.

As stated above, an important characteristic of this invention is in its achievement of high mechanical durability in the preferred embodiments, despite the use of two silver layers which normally would be considered detrimental to achieving this characteristic. While achievement of this high degree of mechanical durability is not believed to be necessarily dependent upon a precise thickness for each layer, nevertheless, it is believed that the thickness of these layers should in most instances be sufficient individually as well as in combination, so as to achieve this result. In preferred embodiments such thicknesses will normally fall within a particular range. The following then represents a range of preferred thicknesses to employ for most systems as contemplated herein.

The term "about" is used in relationship to these thickness ranges and generally herein, to take into account minor variations that may occur depending upon the precise layer system employed, without materially changing the results or characteristics of the system, as well as to take into account normally expected experimental error in their measurements.

Figure 1:
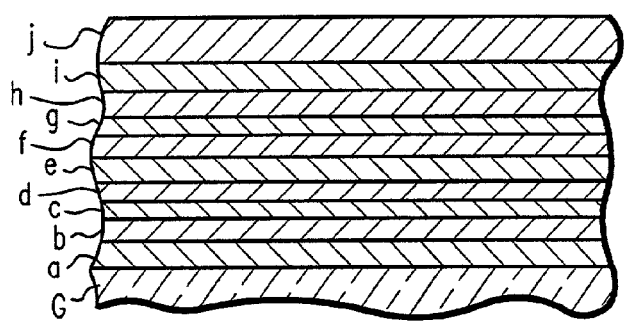
FIG. 1 is a partial side sectional view of an embodiment of a generic product having a layer system according to this invention applied to its substrate surface.

With reference now to FIG. 1, one form of the layer systems of this Invention herein contemplated include at least ten (10) layers. From the glass or other known, equivalent substrate "G" outwardly, the following thicknesses are thus normally employed:

TABLE II

| Layer | Component | Range ("about" Å) | Preferred ("about" Å) | Specific ("about" Å) |
|---|---|---|---|---|
| a | $SnO_x$ x = ≦2.0 | <450 | 300-400 | 360 |
| b | $TiO_x$ x < 2.0 | <90 | 10-50 | 30 |
| c | Ag | 50-200 | 75-150 | 110 |
| d | $NiCrO_x$* | 10-75 | 10-50 | 30 |
| e | $SnO_x$ x = ≦2.0 | 500-1200 | 600-1000 | 820 |
| f | $TiO_x$ x = <2.0 | <90 | 10-50 | 30 |
| g | Ag | 50-200 | 75-150 | 120 |
| h | $NiCrO_x$* | 10-75 | 10-50 | 30 |
| i | $SnO_x$ x = ≦2.0 | 100-500 | 100-300 | 260 |
| j | $Si_3N_4$ | >100 | 100-200 | 185 |

*This term is used herein to describe a mixture of Ni and Cr which becomes oxidized. In most embodiments the Cr becomes heavily oxidized, while at least a portion of the nickel is oxidized such that it may be said that it comprises $NiO_x$ wherein x is equal to or less than 1.0.

Figure 1A:
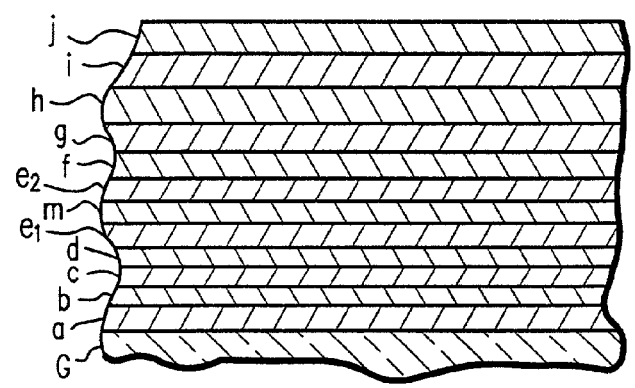
FIG. 1A is a partial side sectional view of an embodiment of a generic product having another layer system according to this invention applied to its substrate.

With reference to FIG. 1A, another form of the layer systems of this invention herein contemplated include at least twelve (12) layers, in that relatively thick layer "e" in the embodiment of FIG. 1 is separated into two layers $e_1$ and $e_2$ of $SnO_x$ separated by a layer of $Si_3N_4$ (designated as layer "m" in FIG. 1A). Otherwise, the layer system remains the same. It has been found that when layer "m" is provided an even further increase in the ability of the system to resist the formation of even small levels of "haze" is achieved. While the reason for this is not entirely understood it is believed that $Si_3N_4$ may serve as a stress reliever in an otherwise rather thick layer of SACS. In addition, it has been surprisingly found that two other known layers used in other systems, perhaps for this purpose, have little or no effect upon haze prevention. These other two materials are silicon oxynitride (usually referred to as $SiO_xN_4$) and zinc stannate (sometimes referred to as $Zn_2SnO_4$; see for example U.S. Pat. No. 4,806,220). Indeed, these two ingredients, which might otherwise be presumed as possible equivalents of $Si_3N_4$ proved not to be. In addition to providing no apparent haze-preventive effect, their use adversely lowered visible transmittance.

It is believed that the achievement of a certain level of substoichiometric oxidation (e.g. x<2.0) in the titanium oxide layers in both of the forms of this invention helps achieve durability, heat treatability and low levels of "haze" in the heat treated article. As aforesaid, "haze," or at least its potential to form in any significant amount is further reduced by the use of layer "m" as shown in FIG. 1A, to separate layer e, now forming two thinner layers $e_1$ and $e_2$. A similar effect occurs with respect to the nickel chromium layers pus (preferably 80/20 percent by weight Ni/Cr) in that the achievement of at least partial oxidation of the nickel up to and including full oxidation aids in the achievement of these same characteristics. Moreover, when $T_{vis}$ at its higher levels is not necessary to achieve, it is preferred that layers d) and h) consist essentially of $NiO_x$ with preferably no chromium employed. In addition, in certain embodiments layers b) and f) may also be $NiO_x$ rather than $TiO_x$.

Layer (j) is a protective overcoat, and in the preferred embodiments is $Si_3N_4$ (i.e. silicon nitride) While other known overcoats such as $SiO_2$ or $SiO_xN_y$ (silicon oxynitride) are possible to use, $Si_3N_4$ has been found to be an excellent overcoat for achieving both mechanical durability and heat treatability.

The preferred substrate is glass (i.e. the known type of glass applicable for its intended end use) However, other substrates may be used such as polycarbonates, polyethyleneteraphalate (PET) and the like.

This invention contemplates that other layers may be added to the ten or twelve layer systems described above, or, in certain embodiments one of the repetitions in the ten layer dual silver system further repeated so as to yield, for example, a repetitive three silver layer system. In the preferred embodiments of this invention, however, the systems herein contemplated "consist essentially of" these ten or twelve layers, which is to say that, any layer added does not adversely affect, or materially change, the characteristic(s) achieved by the system as recited. In the most preferred systems only these ten or twelve layers are used in the order given and thus the system is said to "consist of" these layers. The terms "comprising", "including" and the like are used conventionally as open terms.

To demonstrate the characteristics and results achieved by this invention, the following layer coating systems were formed and analyzed:

EXAMPLE 1

Using an Airco ILS-1600 research coater the following layer system (with reference to FIG. 1) was sputter coated onto various 3 mm thick, clear float glass samples of about 3"×3" to be tested as reported hereinafter.

TABLE III

| Layer | Layer Material[1] | Thickness Angstroms | Speed Inches/min | Passes | Volts | Power kW | Amperage | Argon sccm | Oxygen sccm | Nitrogen sccm | Pressure mTorr |
|---|---|---|---|---|---|---|---|---|---|---|---|
| a | $SnO_x$ | 408A | 42 | 4 | 474 | 1.00 | 2.1 | 40 | 40 | 0 | 3.1 |
| b | $TiO_x$ | 25A | 45 | 2 | 485 | 0.90 | 6.5 | 45 | 10 | 0 | 1.7 |
| c | Ag | 100A | 100 | 1 | 520 | 0.79 | 1.53 | 50 | 0 | 0 | 1.4 |
| d | $NiCrO_x$ | 28A | 100 | 1 | 463 | 0.60 | 4.4 | 40 | 5.5 | 0 | 1.5 |
| e | $SnO_{x1}$ | 816A | 42 | 8 | 474 | 1.00 | 2.1 | 40 | 40 | 0 | 3.1 |
| f | $TiO_x$ | 25A | 45 | 2 | 485 | 0.90 | 6.5 | 45 | 10 | 0 | 1.7 |

TABLE III-continued

| Layer | Layer Material[1] | Thickness Angstroms | Speed Inches/min | Passes | Volts | Power kW | Amperage | Argon sccm | Oxygen sccm | Nitrogen sccm | Pressure mTorr |
|---|---|---|---|---|---|---|---|---|---|---|---|
| g | Ag | 110A | 100 | 1 | 525 | 0.87 | 1.66 | 50 | 0 | 0 | 1.4 |
| h | NiCrO$_x$ | 28A | 100 | 1 | 463 | 0.60 | 4.4 | 40 | 5.5 | 0 | 1.5 |
| i | SnO$_x$ | 260A | 50 | 3 | 474 | 1.00 | 2.1 | 40 | 40 | 0 | 3.1 |
| j | Si$_3$N$_4$ | 185A | 77.5 | 4 | 510 | 0.90 | 1.77 | 50 | 0 | 25 | 1.8 |

A glass substrate sample so formed (e.g. approx. 3"×3" of clear float glass) was then heat treated by heating it to 630° C. for ten minutes and air cooling it to room temperature. In another test sample, a coated sheet (3"×3") and an uncoated sheet were laminated together to simulate an automotive windshield such as that shown in FIG. 5 wherein "A" is inside and "B" is outside, except that in this instance the two sheets were not bent. Both sheets were 3.0 mm thick. The lamination with the aforesaid conventional plastic safety sheet (p.v.b.) in between, and the coating system of this invention on surface S$_2$, was placed in a hotplate press apparatus and heated to 180° F. for five minutes at a pressure of 440 lbs./sq. in. to form the laminate.

The following optical characteristics were achieved when measured using their respective aforesaid conventional test procedures for determining that characteristic.

TABLE IV

Optical Characteristics (Ill 2° C. observer)

|  | Before Heat Treatment | After Heat Treatment | Laminated (heat treated) |
|---|---|---|---|
| TY | 69.20 | 79.51 | 76.06 |
| a* | −5.00 | −3.31 | −4.84 |
| b* | 3.97 | 2.69 | 4.71 |
| RgY | 5.81 | 6.78 | 7.63 |
| a* | 12.77 | 6.52 | 3.37 |
| b* | −12.21 | −2.18 | −3.68 |
| RfY | 4.88 | 5.80 | 7.66 |
| a* | 1.89 | −0.89 | 2.17 |
| b* | −0.70 | 5.35 | −2.40 |
| R$_S$ | 4.30 | 2.90 | laminated |

As can be seen, the laminated article, simulating an automotive windshield has a T$_{vis}$ (i.e. TY) greater than 70%.

A comparison of the mechanical durability achieved by this invention with two known, prior art dual silver layer containing systems as reported in the BACKGROUND section of this text (referred to as STD I and STD II above) was conducted, employing the above-described abrasion test. The two prior art standards were obtained on the marketplace. To pass the text, the coating must show no noticeable scratches when viewed with the naked eye under visible light after 500 cycles. The point of failure is indicated in parentheses in the following table. The test reported below as Ex.1 is the EXAMPLE of this invention prepared as reported above.

TABLE V

|  | Before Heat Treatment | After Heat Treatment |
|---|---|---|
| STD I | — | (10) |
| STD II | — | (250) |
| EX. 1 | >500 | >500 |

As can be seen, the dual silver layer system of this invention was highly durable, passing the abrasion test both before and after heat treatment. The system formed was also heat treatable. In contrast, the other two known dual-silver systems failed the abrasion test after heat treatment.

As stated above, the layer systems of this invention, in certain preferred embodiments, exhibit two other characteristics important to the automotive industry. The first characteristic is referred to as "HAZE", a characteristic descriptive of discontinuities in at least one of the silver layers of the layer system which diffuse the transmitted and reflected visible light thus giving the appearance of spots of "haze" or fog. Lack of "haze" is obviously important in automotive windshields.

"Haze" is a term well understood in the art, and is used herein according to its well known meaning. The measurement of "haze" is determined by ASTM Standard D1003-61 (1977). For purposes of this invention, the preferred layer systems after heat treatment will exhibit a "Haze" of less than 0.40 (as measured by this ASTM Standard. Haze, in this respect, may be measured by using a Gardner HB-4725 HAZE-GUARD PLUS system made by BYK-Gardner of Columbia, Md., which conforms to ASTM D1003-61.

The second characteristic important to the automotive industry is the ability of the windshield to resist delamination. In short, it is the ability of the windshield to not only achieve good adhesion between the glass and polymeric safety sheet (a known quantity in the art), but also between the layer coating and the sheet as well as the layer coating and the glass. Such a characteristic, important to safety in windshields, is determined conventionally by a "pummel" test.

While this invention, to this point, has focused principally on automotive characteristics, it is understood that the coatings herein also find utility in the architectural arts, and in particular in both flat laminates and I.G. units. In such arts the pummel test is not normally relevant, and this is rarely employed in this area of commerce. Attention in this respect is directed now to FIGS. 2A, 2B, 3 and 4 as architectural exemplars. In FIGS. 2A and 4, a typical I.G. unit is illustrated. FIG. 4 shows the IG. unit in an intermediate stage of production. FIG. 2B demonstrates the surface numbering for an I.G. unit (as well as for a laminate).

FIG. 3 is a schematic view of a typical family dwelling 28 having various portals in which the subject invention may be employed. For example, an unheat-treated window 30 may employ as a "storm window" or noise abating system, an I.G. unit of this invention such as is illustrated in FIG. 2A. Sliding door 50 or non-sliding glass door panel 52 as well as front door panel 54 may be so constructed by employing this invention as a heat treated I.G. unit or as a laminate.

With reference to FIG. 2A, there is illustrated, somewhat schematically, a typical I.G. unit in accordance with this invention. In order to differentiate the "inside" of the I.G. unit (labelled "In") from its "outside" (labelled "Out"), the sun 19 is schematically presented. As can be seen, such an I.G. unit is made up of "outside" glass pane (sheet) 21 and "inside" glass pane (sheet) 23. These two glass panes (e.g. float glass of 2 mm=8 mm thick) are sealed at their peripheral edges by a conventional sealant 25 and are provided with a conventional 7 desiccant strip 27. The panes are then retained in a conventional window or door retaining frame 29 (shown in partial schematic form). By sealing the peripheral edges of the glass sheets and replacing the air in chamber 30 with a gas such as argon, a typical, high insulating value I.G. unit is formed. Chamber 20 in this respect is typically about ½" in width. Either inner wall 24 or 25 (or both) may be provided with a layer system of this invention. As illustrated, inner wall 24 of outside glass sheet 21 in this embodiment, has been provided with a sputter-coated layer coating system 22 applied thereto using conventional sputter coating techniques.

Attention is now directed to FIG. 4 wherein there is schematically illustrated a typical two-pane I.G. unit stack prior to sealing. In the I.G. unit of FIG. 4, the prestack employs two typical, clear float glass sheets 31 and 33 separated a selected distance (e.g. 0.1 mm) by glass beads 35. Lower sheet 33, of slightly larger size than upper sheet 31, has a layer system 37 according to this invention sputter coated by conventional techniques onto its inner planar surface 34. Optionally, the inner planar surface 32 of sheet 31 may be used for the layer coating, or both surfaces 32 and 34 may be so employed. A conventional sealant 39 (e.g. a relatively low melting ceramic) is then provided in the peripheral area 41 defined by centering the smaller sheet 31 on the larger sheet 33.

In conventional fashion, sufficient heat is then applied so as to cause sealant 39 to flow and seal the two sheets together thereby to create an insulating chamber 43. Thereafter, after cool down, a vacuum is applied to remove as much air and water vapor as is economically feasible, and optionally to either leave a vacuum or replace the air and water vapor with an inert gas such as Argon. In an alternative technique the edges of the glass are flame sealed, rather than using a sealant. In either instance, heat must be applied to create the seal and drive off the water vapor. Thus the heat treatable layer system embodiments of this invention find unique applicability in I.G. units of the type shown in FIG. 4 wherein the layer system must be able to withstand the heat employed during sealing without adversely affecting its desired characteristics.

In yet another alternative, a vacuum process is not employed and a spacing of ½" for the chamber is effected by various known, conventional techniques. In such a process the insulating chamber is usually filled with Argon so as to displace the air and any water vapor (i.e. humidity or moisture) that might be present.

In this respect, the term "heat treatable" as used herein includes those I.G. unit sealing techniques which employ sufficiently high temperatures that would normally adversely affect or destroy a conventional layer system, but does not include those sealing techniques which employ such low temperatures so as to not affect virtually all coatings used for this purpose.

When forming most I.G. units, multiple "handling" steps are often required, thus necessitating a layer system which is mechanically durable. Moreover, due to the nature of the process and materials employed, chemical durability is required. The preferred embodiments of the layer systems of this invention achieve both chemical and mechanical durability sufficient for conventional I.G. unit construction, thus making them particularly useful in forming I.G. units having excellent U-values and other solar management properties.

The preferred processes and apparatus used to form the layer coating systems of this invention may be any known, conventional sputter-coating system. An example of such systems are the multi-chamber systems produced by Airco, Inc., such as the G-49 large area flat glass sputter coater made by this company.

Attention is now directed to FIG. 5 which, in partial cross-sectional form, illustrates a typical bent laminate 60 according to this invention. It has heretofore been referenced as a typical windshield. It is understood, of course, that laminate 60 need not be bent, i.e. it could be flat and, without the safety polymer sheet 67, could be a skylight or the like used architecturally. Since laminate 60 is bent as illustrated, however, the coating of this invention is heat treatable thus enabling the coating to be applied prior to bending.

In this respect, laminate 60 includes two panes of clear glass 62, 64 respectively, which are sealed together in conventional fashion. Either or both of the inner facial surfaces of panes 62, 64 have, before fabrication and bend, sputter coated thereon a layer system 66 according to invention. The laminate is then constructed and bent, as by heat slumping at the slumping temperature of the glass on a form sled or cradle (sometimes referred to as a "coffin") in conventional fashion to form the curved laminated article which thereafter may be provided with a conventional frame member (not shown for convenience).

The I.G. units formed from either the 10 layer or 12 layer coating system according to this invention achieve not only heat treatability but excellent solar management properties as well. In addition, while some in the art have believes that durability (chemical and/or mechanical) is not important when the layer system is located internally of the two glass panes, such beliefs are not entirely true. Due to the nature of the manufacturing process, not only of laminated windshields as described, but of I.G. units as detailed above, as well, there is often the desirability, if not the necessity, of having a layer system which is both chemically and mechanically durable in order to protect the system from abrasive and corrosive attack which can occur during manufacture before sealing of the unit, and chemical attack thereafter such as from the sealant employed. The preferred embodiments of this invention, as aforesaid achieve both chemical and mechanical durability. The I.G. units, in this respect, reported in the above table, achieved (by passage of the two tests involved) both chemical and mechanical durability.

Once given the above disclosure, many other features, modifications and improvements will become apparent to the skilled artisan. Such features, modifications and improvements are, therefore, considered to be a part of this invention, the scope of which is to be determined by the following claims:

I claim:

1. A coated article including a coating supported by a glass substrate, the coating comprising from the glass substrate outwardly:
   a first dielectric layer comprising tin oxide;
   a layer comprising titanium oxide;
   a first layer comprising Ag;
   a first layer comprising an oxide of NiCr provided over and contacting the layer comprising Ag;
   another layer comprising a tin oxide;
   a layer comprising silicon nitride;
   a layer comprising tin oxide;
   another layer comprising titanium oxide;
   a second layer comprising Ag provided over and contacting the another layer comprising the titanium oxide;

a second layer comprising an oxide of NiCr provided over and contacting the second layer comprising Ag;

a layer comprising a tin oxide; and a layer comprising silicon nitride.

2. The coated article of claim 1, wherein the coated article comprises a vehicle windshield.

3. The coated article of claim 1, wherein the coated article has a haze value of less than 0.4, in accordance with ASTM D1003-61.

4. A heat treated coated article including a coating supported by a glass substrate, the coating comprising from the glass substrate outwardly:

a first layer comprising tin oxide and a second layer comprising an oxide of titanium;

a first layer comprising Ag;

a first layer comprising an oxide of NiCr provided over and contacting the layer comprising Ag;

a layer comprising tin oxide, wherein no metallic layer or metallic layer portion is provided between the first layer comprising the oxide of NiCr and the layer comprising tin oxide;

a layer comprising titanium oxide;

a second layer comprising Ag provided over the layer comprising titanium oxide;

a second layer comprising an oxide of NiCr provided over and contacting the second layer comprising Ag;

a layer comprising tin oxide provided over and contacting the second layer comprising an oxide of NiCr;

a layer comprising silicon nitride provided over and contacting the layer comprising tin oxide that is provided over and contacting the second layer comprising an oxide of NiCr; and wherein the coated article has a visible transmission of greater than 70%.

5. The coated article of claim 4, wherein the coated article has a haze value of less than 0.4, in accordance with ASTM D1003-61.

6. The coated article of claim 1, wherein the coated article is heat treated.

7. The coated article of claim 1, wherein the coated article is heat treated and has a visible transmission of greater than 70%.

* * * * *